United States Patent
Allen et al.

(10) Patent No.: US 10,394,986 B2
(45) Date of Patent: Aug. 27, 2019

(54) MODEL ORDER REDUCTION IN TRANSISTOR LEVEL TIMING

(71) Applicant: INTERNATIONAL BUSINESS MACHINES CORPORATION, Armonk, NY (US)

(72) Inventors: Robert J. Allen, Jericho, VT (US); Yanai Danan, Tel Aviv (IL); Vasant Rao, Fishkill, NY (US); Jeffrey P. Soreff, Los Gatos, CA (US); Xin Zhao, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/989,548

(22) Filed: May 25, 2018

(65) Prior Publication Data

US 2018/0373830 A1 Dec. 27, 2018

Related U.S. Application Data

(62) Division of application No. 14/495,383, filed on Sep. 24, 2014, now Pat. No. 10,031,988.

(51) Int. Cl.
*G06F 17/50* (2006.01)
(52) U.S. Cl.
CPC ................ *G06F 17/5036* (2013.01)
(58) Field of Classification Search
None
See application file for complete search history.

(56) References Cited

U.S. PATENT DOCUMENTS

| | | |
|---|---|---|
| 5,790,415 A | 8/1998 | Pullela et al. |
| 5,901,063 A | 5/1999 | Chang et al. |
| 6,314,546 B1 | 11/2001 | Muddu |
| 6,349,272 B1 | 2/2002 | Phillips |
| 6,853,967 B1 | 2/2005 | Roberts |
| 6,941,258 B2 | 9/2005 | Van Heijningen et al. |
| 8,185,369 B2 | 5/2012 | Haussler et al. |
| 8,341,572 B1 | 12/2012 | Tiwary et al. |

(Continued)

OTHER PUBLICATIONS

Doja, et al., "High Speed Non-Linear Circuit Simulation of Bipolar Junction Transistors" Active and Passive Electronic Components, vol. 22, 1999, pp. 51-73.

(Continued)

*Primary Examiner* — Syed A Roni
(74) *Attorney, Agent, or Firm* — Steven J. Meyers; Andrew M. Calderon; Roberts Mlotkowski Safran Cole & Calderon, P.C.

(57) ABSTRACT

A method of performing transistor simulation with improved sensitivity to parasitic by model order reduction in transistor-level timing is disclosed. The method includes reducing a number of derivative calculations during transistor simulation by representing parasitics as a reduced-order model, wherein the reducing includes: compressing the parasitics to a reduced-order model; simulating with load which is replaced with the reduced-order model; differentiating results of the simulation with respect to reduced-order model parameters; differentiating parameters of the reduced-order model with respect to parasitic values; differentiating the parasitic values with respect to statistical parameters; and computing the differential results of the simulation with respect to the statistical parameters via chain ruling.

10 Claims, 4 Drawing Sheets

(56) References Cited

U.S. PATENT DOCUMENTS

| | | |
|---|---|---|
| 2003/0182639 A1 | 9/2003 | Lehner et al. |
| 2004/0073418 A1 | 4/2004 | Nassif |
| 2006/0080068 A1 | 4/2006 | Feldmann et al. |
| 2008/0172642 A1 | 7/2008 | Abbaspour et al. |
| 2008/0250370 A1 | 10/2008 | Abbaspour et al. |
| 2016/0085890 A1 | 3/2016 | Allen et al. |

OTHER PUBLICATIONS

Rudolph, et al., "Assessment of power-transistor package models: Distributed versus lumped approach" The Scientific World Journal, vol. 2013, Sep. 2010, pp. 86-89.

Dharchoudhury et l., "Analytical fast timing simulation of MOS circuits driving RC interconnects" IEEE, 1996, pp. 111-116.

O'Brien, et al., "Modeling the Driving-Point Characteristic of Resistive Interconnect for Accurate Delay Estimation", IEEE, 1989, pp. 512-515.

Ye, et al., "Fast Variational Interconnect Delay and Slew Computation Using Quadratic Models", Very Large Scale Integration (VLSI) Systems, IEEE Translations on vol. 15, Issue 8, Aug. 2007, pp. 913-926.

"List of IBM Patents or Patent Applications Treated as Related," 1 page.

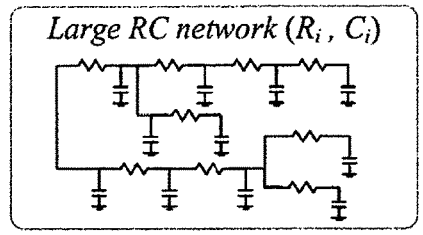
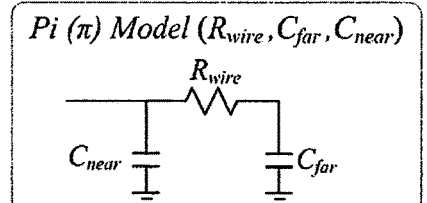
FIG. 2a           FIG. 2b
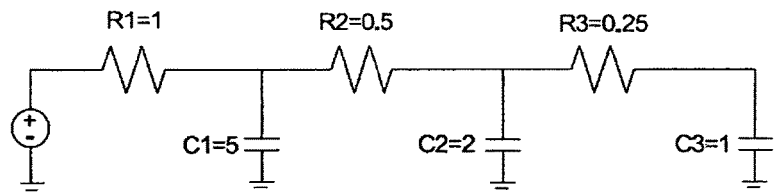
FIG. 3
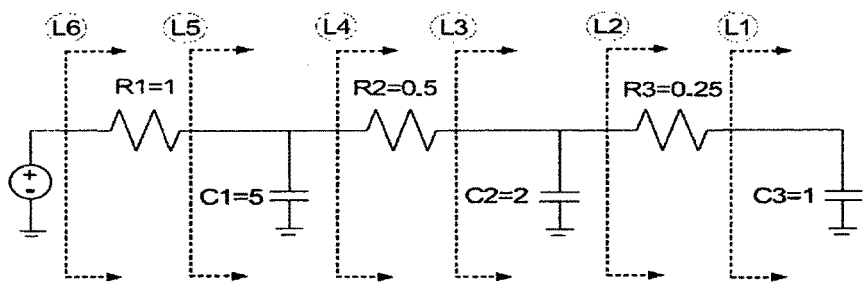
FIG. 4

MODEL ORDER REDUCTION IN TRANSISTOR LEVEL TIMING

FIELD OF THE INVENTION

The invention relates to a method of performing transistor simulation and, more particularly, to a method of performing transistor simulation with improved sensitivity to parasitic by model order reduction in transistor-level timing.

BACKGROUND

Excessive run times are required to determine the derivatives of delay, slew and crossing time with respect to transistor circuits. These derivatives are used during statistical timing analysis. Current methods include asserting sensitivities based on sample circuits, direct and adjoint methods for sensitivity calculations, finite difference methods, and exhaustive simulations. All of these methods have tradeoffs between accuracy and runtimes.

SUMMARY

In an aspect of the invention, a method comprises reducing a number of derivative calculations during transistor simulation by representing parasitics as a reduced-order model, wherein the reducing includes: compressing the parasitics to a reduced-order model; simulating with load which is replaced with the reduced-order model; differentiating results of the simulation with respect to reduced-order model parameters; differentiating parameters of the reduced-order model with respect to parasitic values; differentiating the parasitic values with respect to statistical parameters; and computing the differential results of the simulation with respect to the statistical parameters via chain ruling.

In an aspect of the invention, a method comprises reducing resistive and capacitive elements of a network into a representation of a loading network which has a reduced-order of terms. The method further comprises running simulations with perturbed parameters of the loading network, each with only one parameter changed. The method further comprises finding a finite difference of timing quantities using the simulations and a baseline simulation with no perturbations.

In an aspect of the invention, a system comprises: a CPU, a computer readable memory and a computer readable storage medium; program instructions to compress resistive and capacitive (RC) network to a Pi model; program instructions to simulate the compressed RC network with the Pi model in order to define a delay in the RC network; program instructions to differentiate delay and slew with regard to the Pi model parameters; program instructions to analytically differentiate the Pi model parameters with regard to load RC element values; program instructions to differentiate the load RC element values with regard to statistical parameters; and program instructions to compute derivatives of delay and slew with regard to the statistical parameters by chain ruling. The program instructions are stored on the computer readable storage medium for execution by the CPU via the computer readable memory.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIG. 2a is a schematic of a large RC network;

FIG. 2b is a schematic of a compressed RC network;

FIG. 3 is an example of an RC network;

FIG. 4 shows levels at which moments are computed for the RC network of FIG. 3.

DETAILED DESCRIPTION

Figure 1A:
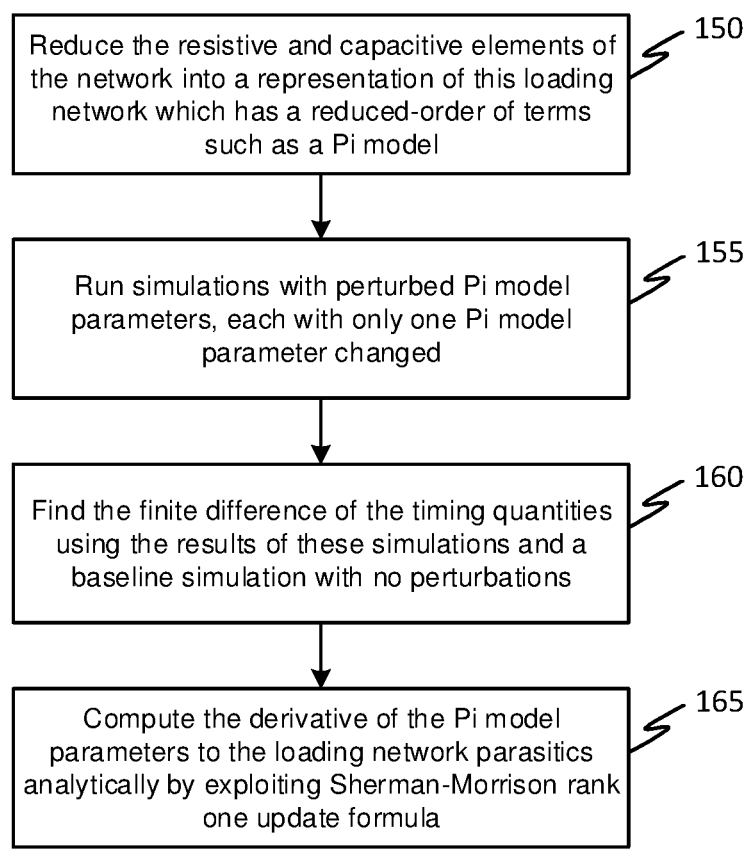
FIGS. 1A and 1B are flowcharts showing processes in accordance with the present invention.

The invention relates to a method of performing transistor simulation and, more particularly, to a method of performing transistor simulation with improved sensitivity to parasitic by model order reduction in transistor-level timing. More specifically, the present invention reduces the computation time in transistor-level timing by reducing the number of derivative calculations during transistor simulation. In embodiments, the reduction of the number of derivative calculations can be accomplished by representing parasitics as a reduced-order model. Advantageously, this reduced-order model reduces the amount of simulation run times significantly.

In more specific embodiments, the method of reducing the number of derivative calculations during transistor simulation by representing the parasitics as a reduced-order model comprises, for example, compressing the parasitics to a reduced-order model and simulating with the load replaced with the reduced model. The method further comprises differentiating the results of the simulation (circuit delay and slew) with respect to reduced-order model parameters and differentiating reduced model parameters with respect to the parasitic values, e.g., analytically or finite difference. The method further comprises computing the differential of simulation results with respect to parasitic parameters via chain-ruling, wherein the reduced-order load model could be used to avoid re-simulating a different circuit instance that has the same input waveform and the same reduced-order load model.

In further embodiments, the method includes finding a circuit and input waveform that is similar except for parasitics, computing a reduced-order model, using the derivative calculated from the previous instance and calculating delay and slew without resimulating. If feasible, the present invention can also use second-order derivatives to set boundaries for using the first-order derivatives. In further embodiments, it is only necessary to redo the differentiating of the reduced model parameters with respect to parasitic values and reuse the simulation differentiated results when interconnect is different but Pi (n) models are identical or within the bounds set by the second derivatives. Also, the perturbations of the reduced model parameters used for the differentiation can be balanced between simulation runtime and result accuracy. The perturbations can be bounded below by the accuracy of the simulator and above by the linearity of the parameter. In further embodiments, the tradeoff between simulation run time and accuracy can be achieved by fitting to several perturbations of delta-reduced-order-model parameter, e.g., both increase and decrease, fit derivative to multiple results rather than just the minimum-direction of increased accuracy at the cost of run time. And, as should be understood by those skilled in the art, the output of the calculation can be used to tune the size of the perturbation, and the ratios of sizes of changes in output can be used to determine if they converged.

Figure 1B:
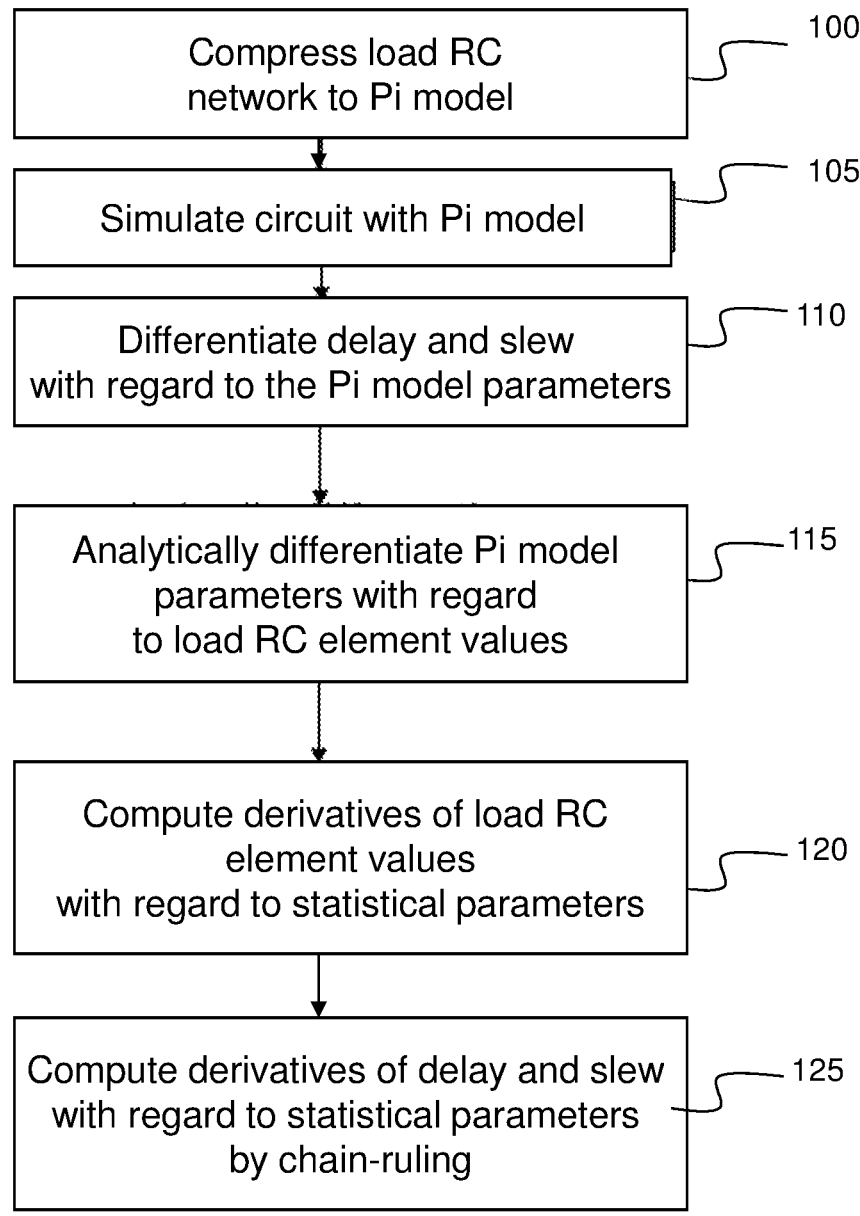

FIGS. 1A and 1B are flowcharts implementing the processes of the present invention. The flowcharts illustrate the functionality and operation of possible implementations of systems, methods, and computer program products according to various embodiments of the present invention. In this regard, each block in the flowcharts may represent a module, segment, or portion of instructions, which comprises one or more executable instructions for implementing the specified logical function(s). It will also be noted that each block of the flowchart illustrations can be implemented by special purpose hardware-based systems that perform the specified functions or acts or carry out combinations of special purpose hardware and computer instructions.

Generally, the processes of the present invention determine the variation of the delay and slew of a transistor circuit with respect to statistical parameters influencing the resistor and capacitive elements of the network loading the output of the circuit. This network loading includes the interconnect wiring and the input capacitance of the loading transistors in later stages. Referring to FIG. 1A, at step 150, the processes of the present invention first reduce the resistive and capacitive elements of the network into a representation of this loading network which has a reduced-order of terms such as a Pi model. At step 155, the processes of the present invention then run simulations with perturbed Pi model parameters, each with only one Pi model parameter changed. At step 160, using the results of these simulations and a baseline simulation with no perturbations, the processes of the present invention find the finite difference of the timing quantities (e.g., difference of delay or slew with and without perturbation divided by amount of perturbation).

By using the Pi model and differentiating with respect to the Pi model parameters, it is no longer necessary to use either the lumped value or the full detailed individual resistive and capacitive values. Also, the present invention analytically calculates the derivatives of the reduced-order model parameters with respect to each resistance (R) and capacitance (C) of the large loading network. From the conductance and capacitance matrices of the loading network, the first three moments of the input admittance for the driving network can be computed, from which each Pi model parameter can be eventually calculated. Still referring to FIG. 1A, at step 165, in this way, it is now possible to compute the derivative of the Pi model parameters to the loading network parasitics analytically by exploiting Sherman-Morrison rank one update formula.

More specifically, referring now to FIG. 1B, at step 100, the processes of the present invention compress the RC network to a Pi model. As should be understood by those skilled in the art, the Pi model accounts for the resistance and capacitance of wiring segments, i.e., $C_{near}$, $R_{wire}$, $C_{far}$. In embodiments, the equations for the Pi model include:

$$C_{far} = y_2^2/y_3$$

$$C_{near} = y_1 - y_2^2/y_3$$

$$R_{wire} = -y_3^2/y_2^3.$$

where $y_1$, $y_2$, and $y_3$ are the first three moments of the input admittance.

By calculation, $(\partial R_{wire}[C_{far}][C_{near}])/(\partial y_1[y_2][y_3])$.

As shown in FIG. 2a, using the existing equations for the Pi model, a large RC network can be compressed to the Pi model as shown in FIG. 2b. In the network shown in FIG. 2b, $C_{far}$, $C_{near}$, and $R_{wire}$ can be changed arbitrarily without regard to the large RC network shown in FIG. 2a. Also, this model can be representative of different delays, i.e., $C_{far}$, $C_{near}$, and $R_{wire}$.

Referring still to FIG. 1B, at step 105, the processes simulate the circuit with the Pi ($\pi$) model in order to define a delay in the network. The simulation of the sensitivity of delay or slew with regard to the Pi model parameters can be represented by the following equation:

$$(\partial_{delay}[slew])/(\partial R_{wire}[C_{far}][C_{near}]).$$

In embodiments, the simulation can be a calculated delay as noted above, or, alternatively, it can be provided by a look-up table or other known methods for a single delay Pi model, e.g., current source model or non-linear delay model. Also, this simulation can be provided for new delays based on different wiring levels or topographies in order to determine the differences between delays at different wiring levels (e.g., M1, M2, etc.) within a circuit.

At step 110, the process differentiates delay and slew with regard to the Pi ($\pi$) model parameters.

At step 115, the process analytically differentiates the Pi model parameters with regard to the load RC element values ($R_i$ and $C_i$). For example, the processes of the present invention use the following analytical equation which are the function of $R_i$ and $C_i$:

$$(\partial y_1[y_2][y_3])/(\partial R_i[C_i]).$$

At steps 120 and 125, the processes of the present invention compute derivatives of delay and slew with regard to the RC load element values by chain ruling. That is, at step 120, the processes of the present invention compute derivatives of load RC element values with regard to statistical parameters. At step 125, the processes of the present invention compute derivatives of delay and slew with regard to statistical parameters by chain ruling. In calculus, the chain rule is a formula for computing the derivative of the composition of two or more functions. That is, if $f$ and $g$ are functions, then the chain rule expresses the derivative of their composition $f \circ g$ (the function which maps x to $f(g(x))$) in terms of the derivatives of $f$ and $g$ and the product of functions · as follows: $(f \circ g)' = (f' \circ g) \cdot g'$. If z is a function of variable y, which is itself a function of x, then z is also a function of x and the chain rule may be written:

$$\frac{dz}{dx} = \frac{dz}{dy} \cdot \frac{dy}{dx}$$

So, in the present invention, for example, $(\partial delay[slew])/(\partial R_i[C_i]) = (\partial delay[slew])/(\partial R_{wire}[C_{far}][C_{near}]) \times (\partial R_{wire}[C_{far}][C_{near}])/(\partial y_1[y_2][y_3]) \times (\partial y_1[y_2][y_3])/(\partial R_i[C_i])$.

In this way, it is now possible to obtain A delay as a function of manufacturing processes variations. Accordingly, the processes of the present invention use the reduced-order model (Pi model) and differentiating with respect to the reduced model parameters rather than either the lumped value or the full detailed individual resistive and capacitive values. Also, the processes of the present invention analytically calculate the derivatives of the reduced-order model (Pi model) parameters with respect to each resistance (R) and capacitance (C) of the large loading network. This can be done for each wiring level (M1, M2, etc.).

By way of more specific example, Matrix $G^{-1}$ is the inverse of conductance matrix G, Matrix C is the capacitance matrix, which is expressed as follows. Matrix G (or $G^{-1}$) and Matrix C are real and symmetric; diagonally dominant; and positive definite.

$$G^{-1} = \begin{bmatrix} r_{1,1} & r_{1,2} & \cdots & r_{1,n} \\ r_{2,1} & r_{2,2} & \cdots & r_{2,n} \\ \vdots & \vdots & \ddots & \vdots \\ r_{n,1} & r_{n,2} & \cdots & r_{n,n} \end{bmatrix}$$

$$C = \begin{bmatrix} c_1 & 0 & \cdots & 0 \\ 0 & c_2 & \cdots & 0 \\ \vdots & \vdots & \ddots & \vdots \\ 0 & 0 & \cdots & c_n \end{bmatrix}.$$

The three moments of the input admittance are expressed as follows.

$$y_1 = 1^T C 1 \quad (1)$$

$$y_2 = -1^T C G^{-1} C 1 \quad (2)$$

$$y_3 = 1^T C G^{-1} C G^{-1} C 1 \quad (3)$$

For a resistor $R_a$ between Node i and Node j, and the perturbation of the conductance $G_a (G_a = 1/R_a)$ is $\Delta$, the conductance matrix G' with the perturbation is $$G' = G + \Delta \begin{bmatrix} 0 \\ \vdots \\ 1 \\ \vdots \\ -1 \\ \vdots \\ 0 \end{bmatrix} [0 \ldots 1 \ldots -1 \ldots 0] \quad (4)$$

$$= G + \Delta u u^T,$$

where u is a column vector, $u_i = 1$ and $u_j = -1$. Refer to Sherman-Morrison formula, the inverse of Matrix G', denoted as $[G']^{-1}$ can be expressed as $$[G']^{-1} = G^{-1} - \frac{\Delta G^{-1} u u^T G^{-1}}{1 + \Delta u^T G^{-1} u}. \quad (5)$$

Consider the term $1 + \Delta u^T G^{-1} u$ in Matrix $[G']^{-1}$ of Equation (5), $$1 + \Delta u^T G^{-1} u = 1 + \Delta [0 \ldots 1 \ldots -1 \ldots 0] \quad (6)$$

$$\begin{bmatrix} r_{1,1} & r_{1,2} & \cdots & r_{1,n} \\ r_{2,1} & r_{2,2} & \cdots & r_{2,n} \\ \vdots & \vdots & \ddots & \vdots \\ r_{n,1} & r_{n,2} & \cdots & r_{n,n} \end{bmatrix} \begin{bmatrix} 0 \\ \vdots \\ 1 \\ \vdots \\ -1 \\ \vdots \\ 0 \end{bmatrix}$$

$$= 1 + \Delta [(r_{i,1} - r_{j,1}) \ (r_{i,2} - r_{j,2}) \ \ldots \ (r_{i,n} - r_{j,n})]$$

$$\begin{bmatrix} 0 \\ \vdots \\ 1 \\ \vdots \\ -1 \\ \vdots \\ 0 \end{bmatrix}$$

$$= 1 + \Delta((r_{i,i} - r_{j,i}) - (r_{i,j} - r_{j,j}))$$

$$= 1 + \Delta(r_{i,i} + r_{j,j} - 2r_{i,j})$$

$$= 1 + \beta_0 \Delta,$$

where $\beta_0 = r_{i,i} + r_{j,j} - 2r_{i,j}$.

Consider the term $G^{-1} u u^T G^{-1}$ in Matrix $[G']^{-1}$ of Equation (5), $$G^{-1} u u^T G^{-1} = \begin{bmatrix} r_{1,1} & r_{1,2} & \cdots & r_{1,n} \\ r_{2,1} & r_{2,2} & \cdots & r_{2,n} \\ \vdots & \vdots & \ddots & \vdots \\ r_{n,1} & r_{n,2} & \cdots & r_{n,n} \end{bmatrix} \begin{bmatrix} 0 \\ \vdots \\ 1 \\ \vdots \\ -1 \\ \vdots \\ 0 \end{bmatrix} [0 \ldots 1 \ldots -1 \ldots 0] \quad (7)$$

$$\begin{bmatrix} r_{1,1} & r_{1,2} & \cdots & r_{1,n} \\ r_{2,1} & r_{2,2} & \cdots & r_{2,n} \\ \vdots & \vdots & \ddots & \vdots \\ r_{n,1} & r_{n,2} & \cdots & r_{n,n} \end{bmatrix}$$

$$= \begin{bmatrix} (r_{1,i} - r_{1,j}) \\ (r_{2,i} - r_{2,j}) \\ \vdots \\ (r_{n,i} - r_{n,j}) \end{bmatrix} [(r_{i,1} - r_{j,1}) \ (r_{i,2} - r_{j,2}) \ \ldots \ (r_{i,n} - r_{j,n})]$$

$$= \begin{bmatrix} r^1 \\ r^2 \\ \vdots \\ r^n \end{bmatrix} [r^1 \ r^2 \ \ldots \ r^n]$$

$$= \begin{bmatrix} r^1 r^1 & r^1 r^2 & \cdots & r^1 r^n \\ r^2 r^1 & r^2 r^2 & \cdots & r^2 r^n \\ \vdots & \vdots & \ddots & \vdots \\ r^n r^1 & r^n r^2 & \cdots & r^n r^n \end{bmatrix},$$

where, $r^k = (r_{k,i} - r_{k,j}) = (r_{i,k} - r_{j,k})$.

Let Matrix $B = \begin{bmatrix} r^1 r^1 & r^1 r^2 & \cdots & r^1 r^n \\ r^2 r^1 & r^2 r^2 & \cdots & r^2 r^n \\ \vdots & \vdots & \ddots & \vdots \\ r^n r^1 & r^n r^2 & \cdots & r^n r^n \end{bmatrix},$ where $b_{k,l} = r^k r^l = r^l r^k$.

Equation (5) is then represented by:

$$[G']^{-1} = G^{-1} - \frac{\Delta}{1 + \beta_0 \Delta} B. \quad (8)$$

Use Matrix D to denote Matrix $[G']^{-1}$, then $D=[G']^{-1}$, where $$d_{k,l} = r_{k,l} - \frac{\Delta}{1+\beta_0\Delta} r^k r^l.$$

Moment $y_2$ is $$y_2 = -1^T CG^{-1}C1 \quad (9)$$

$$= -[c_1 \ c_2 \ \ldots \ c_n] G^{-1} \begin{bmatrix} c_1 \\ c_2 \\ \vdots \\ c_n \end{bmatrix}$$

$$= -\sum_k \sum_l c_k c_l r_{k,l}.$$

Moment $y_2$ with perturbation, denoted as Moment $y'_2$ is $$y'_2 = -1^T C[G']^{-1}C1 \quad (10)$$

$$= -1^T CDC1$$

$$= -\sum_k \sum_l c_k c_l d_{k,l}$$

$$= -\sum_k \sum_l c_k c_l \left(r_{k,l} - \frac{\Delta}{1+\beta_0\Delta} r^k r^l\right).$$

The second moment change due to the perturbation divided by the perturbation is:

$$\frac{y'_2 - y_2}{\Delta} = \frac{-\sum_k \sum_l c_k c_l \left(r_{k,l} - \frac{\Delta}{1+B_0\Delta} r^k r^l\right) + \sum_k \sum_l c_k c_l r_{k,l}}{\Delta} \quad (11)$$

$$= \frac{\sum_k \sum_l c_k c_l \left(\frac{\Delta}{1+\beta_0\Delta} r^k r^l\right)}{\Delta}$$

$$= \sum_k \sum_l c_k c_l r^k r^l \frac{1}{1+\beta_0\Delta}.$$

So the derivatives of $y_2$ with respect to Conductance $G_a$ is expressed as follows:

$$\frac{\partial y_2}{\partial G_a} = \lim_{\Delta \to 0} \frac{y'_2 - y_2}{\Delta} = \sum_k \sum_l c_k c_l r^k r^l, \quad (12)$$

where $\Delta$ is the perturbation of the conductance $G_a$ on the resistor between Node i and Node j, $\beta_0 = r_{i,i} + r_{j,j} - 2r_{i,j}$, $r^k = (r_{i,k} - r_{j,k})$, $k,l = 1, 2, \ldots, n$.

And, Moment $y_3$ is expressed as follows:

$$y_3 = 1^T CG^{-1}CG^{-1}C1$$

$$= [c_1 \ c_2 \ \ldots \ c_n] \begin{bmatrix} r_{1,1} & r_{1,2} & \ldots & r_{1,n} \\ r_{2,1} & r_{2,2} & \ldots & r_{2,n} \\ \vdots & \vdots & \ddots & \vdots \\ r_{n,1} & r_{n,2} & \ldots & r_{n,n} \end{bmatrix} \begin{bmatrix} c_1 & 0 & \ldots & 0 \\ 0 & c_2 & \ldots & 0 \\ \vdots & \vdots & \ddots & \vdots \\ 0 & 0 & \ldots & c_n \end{bmatrix}$$

$$\begin{bmatrix} r_{1,1} & r_{1,2} & \ldots & r_{1,n} \\ r_{2,1} & r_{2,2} & \ldots & r_{2,n} \\ \vdots & \vdots & \ddots & \vdots \\ r_{n,1} & r_{n,2} & \ldots & r_{n,n} \end{bmatrix} \begin{bmatrix} c_1 \\ c_2 \\ \vdots \\ c_n \end{bmatrix}$$

$$= \left[\sum_k c_k r_{k,1} \ \sum_k c_k r_{k,2} \ \ldots \ \sum_k c_k r_{k,n}\right] \begin{bmatrix} c_1 & 0 & \ldots & 0 \\ 0 & c_2 & \ldots & 0 \\ \vdots & \vdots & \ddots & \vdots \\ 0 & 0 & \ldots & c_n \end{bmatrix}$$

$$\begin{bmatrix} \sum_k c_k r_{1,k} \\ \sum_k c_k r_{2,k} \\ \vdots \\ \sum_k c_k r_{n,k} \end{bmatrix}.$$

Let $\alpha_l = \Sigma_k c_k r_{k,l} = \Sigma_k c_k r_{l,k}$, then $y_3$ is $$y_3 = c_1 \alpha_1^2 + c_2 \alpha_2^2 + \ldots + c_n \alpha_n^2 \quad (13)$$

$$= \sum_k c_k \alpha_k^2$$

$$= \beta_2$$

where $\beta_2 = \sum_k c_k \alpha_k^2$.

Moment $y_3$ with perturbation, denoted as Moment $y'_3$ is $$y'_3 = 1^T C[G']^{-1}C[G']^{-1}C1$$

$$= 1^T CDCDC1$$

$$= [c_1 \ c_2 \ \ldots \ c_n] \begin{bmatrix} d_{1,1} & d_{1,2} & \ldots & d_{1,n} \\ d_{2,1} & d_{2,2} & \ldots & d_{2,n} \\ \vdots & \vdots & \ddots & \vdots \\ d_{n,1} & d_{n,2} & \ldots & d_{a,n} \end{bmatrix}$$

$$\begin{bmatrix} c_1 & 0 & \ldots & 0 \\ 0 & c_2 & \ldots & 0 \\ \vdots & \vdots & \ddots & \vdots \\ 0 & 0 & \ldots & c_n \end{bmatrix} \begin{bmatrix} d_{1,1} & d_{1,2} & \ldots & d_{1,n} \\ d_{2,1} & d_{2,2} & \ldots & d_{2,n} \\ \vdots & \vdots & \ddots & \vdots \\ d_{n,1} & d_{n,2} & \ldots & d_{n,n} \end{bmatrix} \begin{bmatrix} c_1 \\ c_2 \\ \vdots \\ c_n \end{bmatrix}$$

$$= \left[\sum_k c_k d_{k,\lambda} \ \sum_k c_k d_{k,2} \ \ldots \ \sum_k c_k d_{k,n}\right]$$

$$\begin{bmatrix} c_1 & 0 & \ldots & 0 \\ 0 & c_2 & \ldots & 0 \\ \vdots & \vdots & \ddots & \vdots \\ 0 & 0 & \ldots & c_n \end{bmatrix} \begin{bmatrix} \sum_k c_k d_{1,k} \\ \sum_k c_k d_{2,k} \\ \vdots \\ \sum_k c_k d_{n,k} \end{bmatrix}.$$

Recall $$d_{k,l} = r_{k,l} - \frac{\Delta}{1+\beta_0\Delta} r^k r^l, \quad b_{k,l} = r^k r^l$$

Let $$\Delta' = \frac{\Delta}{1+\beta_0\Delta}.$$

Then $$d'_{k,l} = d_{l,k} = r_{k,l} - \Delta' b_{k,l}$$

Replace $d_{k,l}$ by $r_{k,l} - \Delta' b_{k,l}$,

Moment $y'_3$ is expressed as $$y'_3 = \left[\sum_k c_k(r_{k,1} - \Delta' b_{k,1}) \sum_k c_k(r_{k,2} - \Delta' b_{k,2}) \ldots \sum_k c_k(r_{k,n} - \Delta' b_{k,n})\right]$$

$$\begin{bmatrix} c_1 & 0 & \cdots & 0 \\ 0 & c_2 & \cdots & 0 \\ \vdots & \vdots & \ddots & \vdots \\ 0 & 0 & \cdots & c_n \end{bmatrix} \begin{bmatrix} \sum_k c_k(r_{1,k} - \Delta' b_{1,k}) \\ \sum_k c_k(r_{2,k} - \Delta' b_{2,k}) \\ \vdots \\ \sum_k c_k(r_{n,k} - \Delta' b_{n,k}) \end{bmatrix}$$

$$= [\alpha_1 - \gamma_1\Delta' \; \alpha_2 - \gamma_2\Delta' \; \ldots \; \alpha_n - \gamma_n\Delta']$$

$$\begin{bmatrix} c_1 & 0 & \cdots & 0 \\ 0 & c_2 & \cdots & 0 \\ \vdots & \vdots & \ddots & \vdots \\ 0 & 0 & \cdots & c_n \end{bmatrix} \begin{bmatrix} \alpha_1 - \gamma_1\Delta' \\ \alpha_2 - \gamma_2\Delta' \\ \vdots \\ \alpha_n - \gamma_n\Delta' \end{bmatrix},$$

where $\alpha_l$ has been defined as $\alpha_l = \Sigma_k c_k r_{k,l} = \Sigma_k c_k r_{l,k}$, $\gamma_l = \Sigma_k c_k b_{k,l} = \Sigma_k c_k b_{l,k}$.

$$y'_3 = c_1(\alpha_1 - \gamma_1\Delta')^2 + c_2(\alpha_2 - \gamma_2\Delta')^2 + \cdots + c_n(\alpha_n - \gamma_n\Delta')^2 \quad (14)$$

$$= \sum_k c_k \alpha_k^2 - \left(2\sum_k c_k \alpha_k \gamma_k\right)\Delta' + \left(\sum_k c_k \gamma_k^2\right)(\Delta')^2$$

$$= \beta_2 - \beta_3\Delta' + \beta_4(\Delta')^2$$

where $\beta_2 = \Sigma_k c_k \alpha_k^2$, $\beta_3 = 2\Sigma_k c_k \alpha_k \gamma_k$, $\beta_4 = \Sigma_k c_k \gamma_k^2$.

Recall $$y_3 = \sum_k c_k \alpha_k^2 = \beta_2, \quad \Delta' = \frac{\Delta}{1+\beta_0\Delta}.$$

The third moment change due to the perturbation divided by the perturbation is:

$$\frac{y'_3 - y_3}{\Delta} = \frac{\beta_2 - \beta_3\Delta' + \beta_4(\Delta')^2 - \beta_2}{\Delta} \quad (15)$$

$$= \frac{-\beta_3 \frac{\Delta}{1+\beta_0\Delta} + \beta_4\left(\frac{\Delta}{1+\beta_0\Delta}\right)^2}{\Delta}$$

$$= \frac{-\beta_3}{1+\beta_0\Delta} + \frac{\beta_4\Delta}{1 + 2\beta_0\Delta + \beta_0^2\Delta^2}.$$

So the derivatives of $y_3$ with respect to Conductance $G_a$ is expressed as follow:

$$\frac{\partial y_3}{\partial G_a} = \lim_{\Delta \to 0} \frac{y'_3 - y_3}{\Delta} = -\beta_3. \quad (16)$$

Recall $G_a = 1/R_a$.

By performing the chain rule, the derivatives of the three moments with respect to $R_a$ are expressed as $$\frac{\partial y_1}{\partial R_a} = 0 \quad (17)$$

$$\frac{\partial y_2}{\partial R_a} = \frac{\partial y_2}{\partial G_a} \frac{\partial G_a}{\partial R_a} = \frac{-\sum_k \sum_l c_k c_l r^k r^l}{R_a^2} \quad (18)$$

$$\frac{\partial y_3}{\partial R_a} = \frac{\partial y_3}{\partial G_a} \frac{\partial G_a}{\partial R_a} = \frac{\beta_3}{R_a^2} \text{ where} \quad (19)$$

$\beta_3 = 2\sum_l c_l \alpha_l \gamma_l, \; \alpha_l = \sum_k c_k r_{k,l},$ $\gamma_l = \sum_k c_k b_{k,l}, \; r^l = (r_{l,i} - r_{l,j}), \; b_{k,l} = r^k r^l.$ An example of an RC network is shown in FIG. 3. Two methods will be used to calculate the derivatives of the three moments with respect to the resistance $R_3$. Method I is a classic method and Method II is the analytical expressions (Equations (17) to (19)) derived herein. In Method I, the processes calculate the three moments at each level by tracing from downstream back to upstream of the network as shown in FIG. 4, considering the perturbation on $R_3$.

The calculation of three moments following the rules in Method I is as follows $$\text{Add } C_3 = 1 \Rightarrow \begin{cases} y_1^{L_1} = 1 \\ y_2^{L_1} = 0 \\ y_3^{L_1} = 0 \end{cases}$$

$$\text{Add } R_3 \Rightarrow \begin{cases} y_1^{L_2} = 1 \\ y_2^{L_2} = -R_3 \\ y_3^{L_2} = R_3^2 \end{cases}$$

$$\text{Add } C_2 = 2 \Rightarrow \begin{cases} y_1^{L_3} = 3 \\ y_2^{L_3} = -R_3 \\ y_3^{L_3} = R_3^2 \end{cases}$$

-continued $$\text{Add } R_2 = 0.5 \Rightarrow \begin{cases} y_1^{L4} = 3 \\ y_2^{L4} = -R_3 - 0.5 \times 3^2 = -R_3 - 4.5 \\ y_3^{L4} = \begin{array}{c} R_3^2 - 2 \times 0.5 \times 3(-R_3) + \\ (0.5)^2(3)^3 = R_3^2 + 3R_3 + 6.75 \end{array} \end{cases}$$

$$\text{Add } C_1 = 5 \Rightarrow \begin{cases} y_1^{L5} = 3 + 5 = 8 \\ y_2^{L5} = -R_3 - 4.5 \\ y_3^{L5} = R_3^2 + 3R_3 + 6.75 \end{cases}$$

$$\text{Add } R_1 = 1 \Rightarrow \begin{cases} y_1^{L6} = 8 \\ y_2^{L6} = \begin{array}{c} -R_3 - 4.5 - 1 \times (8)^2 = \\ -R_3 - 68.5 \end{array} \\ y_3^{L6} = \begin{array}{c} R_3^2 + 3R_3 + 6.75 - 2 \times 8 \times \\ (-R_3 - 4.5) + 1^2 \times (8)^3 = \\ R_3^2 + 19R_3 + 590.75 \end{array} \end{cases}$$

Therefore, the derivatives of the three moments with respect to $R_3$ are expressed as follows $$\frac{\partial y_1}{\partial R_3} = 0 \quad (20)$$

$$\frac{\partial y_2}{\partial R_3} = -1 \quad (21)$$

$$\frac{\partial y_3}{\partial R_3} = 2R_3 + 19 = 19.5. \quad (22)$$

In Method II, the capacitance matrix is as follows:

$$C = \begin{bmatrix} C_1 & 0 & 0 \\ 0 & C_2 & 0 \\ 0 & 0 & C_3 \end{bmatrix} = \begin{bmatrix} 5 & 0 & 0 \\ 0 & 2 & 0 \\ 0 & 0 & 1 \end{bmatrix} = \begin{bmatrix} c_1 & 0 & 0 \\ 0 & c_2 & 0 \\ 0 & 0 & c_3 \end{bmatrix}. \quad (23)$$

The conductance matrix is as follows $$G = \begin{bmatrix} G_1 + G_2 & -G_2 & 0 \\ -G_2 & G_2 + G_3 & -G_3 \\ 0 & -G_3 & G_3 \end{bmatrix} = \begin{bmatrix} 3 & -2 & 0 \\ -2 & 6 & -4 \\ 0 & -4 & 4 \end{bmatrix} \quad (24)$$

$$G^{-1} = \begin{bmatrix} R_1 & R_1 & R_1 \\ R_1 & R_1 + R_2 & R_1 + R_2 \\ R_1 & R_1 + R_2 & R_1 + R_2 + R_3 \end{bmatrix} = \quad (25)$$

$$\begin{bmatrix} 1 & 1 & 1 \\ 1 & 1.5 & 1.5 \\ 1 & 1.5 & 1.75 \end{bmatrix} = \begin{bmatrix} r_{1,2} & r_{1,2} & r_{1,3} \\ r_{2,1} & r_{2,2} & r_{2,3} \\ r_{3,1} & r_{3,2} & r_{3,3} \end{bmatrix}.$$

$R_3$ is between Node 2 and Node 3, $i=2$, and $j=3$. Recall that $$r_k = (r_{k,i} - r_{k,j}) = (r_{i,k} - r_{j,k}).$$

Then, $r^1$ to $r^3$ can be expressed as follows $$r^1 = r_{1,i} - r_{1,j} = r_{1,2} - r_{1,3} = 0$$

$$r^2 = r_{2,i} - r_{2,j} = r_{2,2} - r_{2,3} = 0$$

$$r^3 = r_{3,i} - r_{3,j} = r_{3,2} - r_{3,3} = -0.25$$

Equation (18) is then expressed as follows $$\frac{\partial y_2}{\partial R_3} = \frac{-\sum_{k=1}^{3}\sum_{l=1}^{3} c_k c_l r^k r^l}{R_3^2} = \frac{c_3 c_3}{R_3^2} = -\frac{(-0.25)^2}{0.25^2} = -1. \quad (26)$$

This confirms with the result in Equation (21) of Method 1.

Also, recall that $$\alpha_l = \Sigma_k c_k r_{k,l}$$

$\alpha_1$ to $\alpha_3$ are expressed as follows $$\alpha_1 = c_1 r_{1,1} + c_2 r_{2,1} + c_3 r_{3,1} = 8$$

$$\alpha_2 = c_1 r_{1,2} + c_2 r_{2,2} + c_3 r_{3,2} = 9.5$$

$$\alpha_3 = c_1 r_{1,3} + c_2 r_{2,3} + c_3 r_{3,3} = 9.75$$

Recall that $$b_{k,l} = r^k r^l.$$

Then $$b_{3,3} = r^3 r^3 = 0.625.$$

And other $b_{k,l} = 0$

Recall that $$\gamma_l = \Sigma_k c_k b_{k,l}$$

Then $$\gamma_1 = \gamma_2 = 0, \gamma_3 = c_1 b_{1,3} + c_2 b_{2,3} + c_3 b_{3,3} = 0.625$$

Recall that $$\beta_3 = 2\Sigma_l c_l \alpha_l \gamma_l.$$

Then $$\beta_3 = 2(c_1 \alpha_1 \gamma_1 + c_2 \alpha_2 \gamma_2 + c_3 \alpha_3 \gamma_3) = 2 \times 1 \times 9.75 \times 0.625 = 12.1875.$$

Equation (19) is then expressed as $$\frac{\partial y_3}{\partial R_3} = \frac{\beta_3}{R_3^2} = \frac{12.1875}{0.25^2} = 19.5. \quad (27)$$

It confirms with the result in Equation (22) of Method 1.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Figure 5:
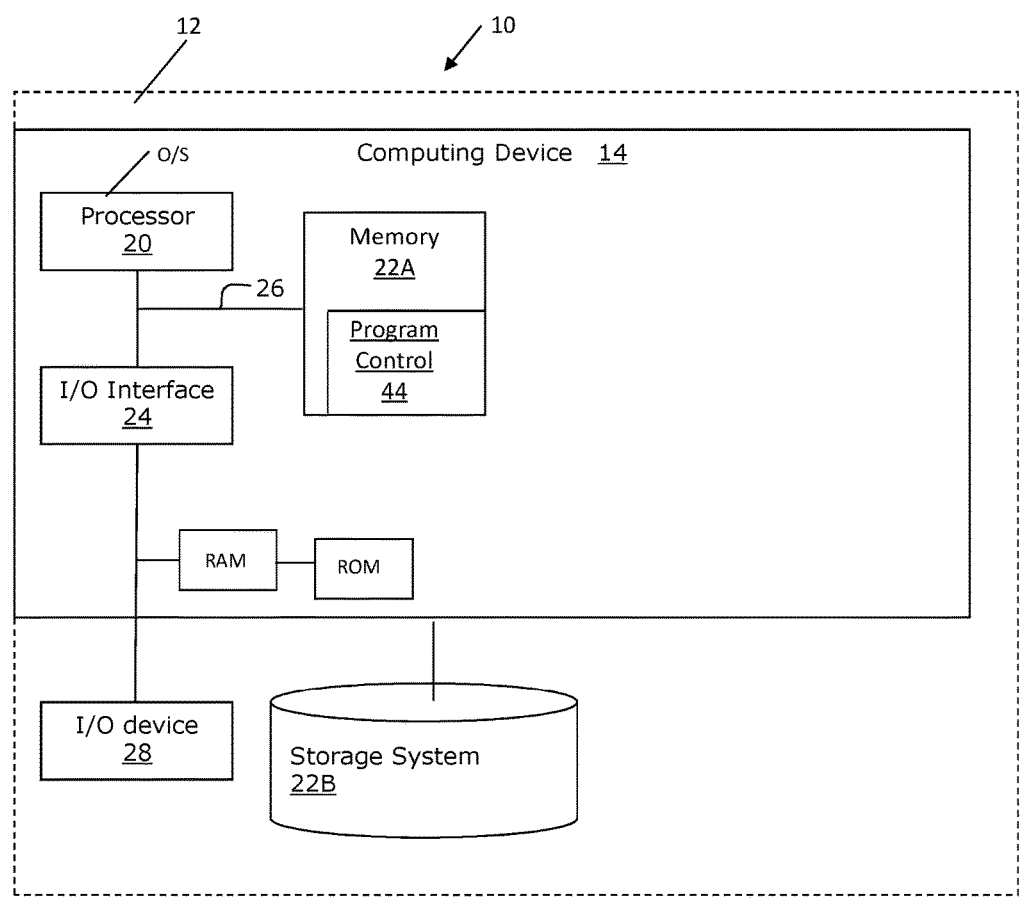
FIG. 5 is a computer infrastructure which can perform the processes of the present invention.

FIG. 5 shows an illustrative environment 10 for managing the processes in accordance with the invention. To this extent, environment 10 includes a server 12 or other computing system that can perform the processes described herein. In particular, server 12 includes a computing device 14. The computing device 14 can be resident on a network infrastructure or computing device of a third party service provider. The computing device 14 also includes a processor 20 (e.g., CPU), memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with external I/O device/resource 28 and storage system 22B. For example, I/O device 28 can comprise any device that enables an individual to interact with computing device 14 (e.g., user interface) or any device that enables computing device 14 to communicate with one or more other computing devices using any type of communications link. The external I/O device/resource 28 may be for example, a handheld device, PDA, handset, keyboard etc.

In general, processor 20 executes computer program code (e.g., program control 44), which can be stored in memory 22A and/or storage system 22B. Moreover, in accordance with aspects of the invention, program control 44 performs the processes described herein. The processes can be implemented as one or more program code in program control 44 stored in memory 22A as separate or combined modules. Additionally, the processes may be implemented as separate dedicated processors or a single or several processors to provide the function of these tools. While executing the computer program code, the processor 20 can read and/or write data to/from memory 22A, storage system 22B, and/or I/O interface 24. The program code executes the processes of the invention. The bus 26 provides a communications link between each of the components in computing device 14.

The computing device 14 can comprise any general purpose computing article of manufacture capable of executing computer program code installed thereon (e.g., a personal computer, server, etc.). However, it is understood that computing device 14 is only representative of various possible equivalent-computing devices that may perform the processes described herein. To this extent, in embodiments, the functionality provided by computing device 14 can be implemented by a computing article of manufacture that includes any combination of general and/or specific purpose hardware and/or computer program code. In each embodiment, the program code and hardware can be created using standard programming and engineering techniques, respectively.

Similarly, server 12 is only illustrative of various types of computer infrastructures for implementing the invention. For example, in embodiments, server 12 comprises two or more computing devices (e.g., a server cluster) that communicate over any type of communications link, such as a network, a shared memory, or the like, to perform the process described herein. Further, while performing the processes described herein, one or more computing devices on server 12 can communicate with one or more other computing devices external to server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
reducing resistive and capacitive elements of a network into a representation of a loading network which has a reduced-order of terms, wherein the reduced-order of terms is a Pi ($\pi$) model;
running simulations with perturbed parameters of the loading network, each with only one parameter changed;
finding a finite difference of timing quantities using the simulations and a baseline simulation with no perturbations;
computing a derivative of parameters of the Pi model to loading network parasitics analytically by exploiting Sherman-Morrison rank one update formula; and
fabricating a chip including a circuit having the finite difference of the timing quantities and the loading network parasitics.

2. The method of claim 1, wherein the simulations are provided with perturbed Pi ($\pi$) model parameters, each with only one Pi model parameter changed.

3. The method of claim 1, further comprising:
analytically calculating derivatives of reduced-order model parameters of the loading network with respect to each resistance (R) and capacitance (C); and
from conductance and capacitance matrices of the loading network, computing first three moments of input admittance, from which each of the Pi model parameters can be calculated.

4. The method of claim 1, wherein the Pi model accounts for resistance and capacitance of wiring segments as defined by $C_{near}$, $R_{wire}$, $C_{far}$ wherein:

$$C_{far} = y_2^2/y_3$$

$$C_{near} = y_1 - y_2^2/y_3$$

$$R_{wire} = -y_3^2/y_2^3$$

where, $y_1$, $y_2$ and $y_3$ are first three moments of input admittance; and by calculation, $(\partial R_{wire} \ [C_{far}][C_{near}]Y(\partial y_1 [y_2][y_3])$.

5. The method of claim 1, wherein the running simulations comprises simulating the loading network with the Pi model in order to define a delay in the network represented by $$(\partial_{delay}[\text{slew}])/(\partial R_{wire}[C_{far}][C_{near}]).$$

6. The method of claim 5, wherein the simulating the loading network with the Pi model in order to define the delay in the network is one of a calculated delay, a look up table, current source model or non-linear delay model.

7. The method of claim 5, further comprising differentiating delay and slew with regard to the Pi model parameters as defined by $\Delta \text{delay}/\Delta \pi$ model.

8. The method of claim 1, wherein the timing quantities comprise delay or slew with perturbation−delay or slew without perturbation/amount of perturbation.

9. The method of claim 1, wherein perturbations of the parameters of the loading network are balanced between simulation run-times and accuracy of result.

10. The method of claim 9, wherein the perturbations of the parameters of the loading network are bounded below by accuracy of a simulator and above by linearity of the parameters of the loading network.

* * * * *